US011145567B2

(12) United States Patent
Akedo et al.

(10) Patent No.: US 11,145,567 B2
(45) Date of Patent: Oct. 12, 2021

(54) HEAT-RADIATING SUBSTRATE

(71) Applicant: NATIONAL INSTITUTE OF ADVANCED INDUSTRIAL SCIENCE AND TECHNOLOGY, Tokyo (JP)

(72) Inventors: Jun Akedo, Ibaraki (JP); Hiroki Tsuda, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 39 days.

(21) Appl. No.: 16/058,573

(22) Filed: Aug. 8, 2018

(65) Prior Publication Data
US 2018/0358281 A1  Dec. 13, 2018

Related U.S. Application Data (63) Continuation of application No. PCT/JP2017/006763, filed on Feb. 23, 2017.

(30) Foreign Application Priority Data

Feb. 26, 2016 (JP) .............................. JP2016-036032

(51) Int. Cl.
*F28F 7/00* (2006.01)
*H01L 23/373* (2006.01)
(Continued)

(52) U.S. Cl.
CPC ............ *H01L 23/3735* (2013.01); *F28F 3/00* (2013.01); *F28F 21/04* (2013.01); *F28F 21/08* (2013.01);
(Continued)

(58) Field of Classification Search
CPC ... H01L 23/3735; H01L 23/12; H01L 23/142; H01L 23/15; H01L 23/36; H01L 23/3731;
(Continued)

(56) References Cited

U.S. PATENT DOCUMENTS 5,153,077 A    10/1992  Kashiba et al.
5,368,898 A *  11/1994  Akedo .................. B05D 3/203
                                                        427/128
(Continued)

FOREIGN PATENT DOCUMENTS

CN      102917534 A    2/2013
EP      2 500 936 A1   9/2012
(Continued)

OTHER PUBLICATIONS

International Search Report for corresponding international application PCT/JP2017/006763 dated Apr. 18, 2017, citing the above references.

(Continued)

*Primary Examiner* — Claire E Rojohn, III
(74) *Attorney, Agent, or Firm* — Hauptman Ham, LLP (57) ABSTRACT

A heat-radiating substrate with a high insulation-withstand voltage and an excellent heat-radiating property is provided. The heat-radiating substrate includes: a metal base material; a metal thin layer formed over the metal base material and having a hardness higher than a hardness of the metal base material; and a ceramic layer over the metal thin layer. Alternatively, the heat-radiating substrate includes, instead of the metal thin layer, a hardened layer serving as a surface layer of the metal base material and having a hardness higher than the hardness of the metal base material. The metal thin layer and the hardened layer are able to enhance compres-
(Continued)

sive stress or prevent release of the compressive stress generated in the ceramic layer by a mechanical impact applied to the ceramic layer.

9 Claims, 4 Drawing Sheets

(51) Int. Cl.
*H01L 23/36* (2006.01)
*H01L 23/12* (2006.01)
*F28F 3/00* (2006.01)
*F28F 21/04* (2006.01)
*F28F 21/08* (2006.01)
*H01L 23/14* (2006.01)
*H01L 23/15* (2006.01)

(52) U.S. Cl.
CPC ............ *H01L 23/12* (2013.01); *H01L 23/142* (2013.01); *H01L 23/15* (2013.01); *H01L 23/36* (2013.01); *H01L 23/3731* (2013.01); *H01L 23/3736* (2013.01)

(58) Field of Classification Search
CPC ....... H01L 23/3736; F28F 21/04; F28F 21/08; F28F 3/00
See application file for complete search history.

(56) References Cited

U.S. PATENT DOCUMENTS

| | | | |
|---|---|---|---|
| 5,707,715 A | 1/1998 | deRochemont et al. | |
| 2004/0227227 A1* | 11/2004 | Imanaka | H01L 21/4857 257/700 |
| 2005/0199992 A1* | 9/2005 | Baek | H01L 25/0652 257/686 |
| 2005/0231073 A1* | 10/2005 | Sugahara | B41J 2/1642 310/328 |
| 2006/0245023 A1* | 11/2006 | Akedo | G02B 26/085 359/223.1 |
| 2007/0046156 A1* | 3/2007 | Yasui | B41J 2/161 310/363 |
| 2007/0069174 A1* | 3/2007 | Natsuhara | C04B 41/5031 252/62.55 |
| 2012/0298408 A1 | 11/2012 | Nagatomo et al. | |
| 2013/0169899 A1* | 7/2013 | Tsuda | G02F 1/13306 349/42 |
| 2014/0138710 A1* | 5/2014 | Ohtsu | H01L 24/89 257/77 |
| 2014/0197527 A1* | 7/2014 | Mengel | H01L 21/56 257/676 |
| 2014/0284040 A1* | 9/2014 | Colgan | H01L 23/373 165/185 |
| 2015/0118794 A1* | 4/2015 | Lin | H01L 23/3675 438/107 |
| 2015/0130046 A1* | 5/2015 | Lin | H01L 25/50 257/712 |
| 2015/0284296 A1* | 10/2015 | Osanai | C04B 37/026 428/141 |
| 2016/0041445 A1* | 2/2016 | Tsuda | G02F 1/13338 349/12 |
| 2016/0349560 A1* | 12/2016 | Tsuda | G02F 1/13394 |

FOREIGN PATENT DOCUMENTS

| | | |
|---|---|---|
| EP | 2 732 967 A1 | 5/2014 |
| EP | 2922090 A1 | 9/2015 |
| JP | 2001-308438 A | 11/2001 |
| JP | 2006-128286 A | 5/2006 |
| JP | 2006128286 A * | 5/2006 |
| JP | 2007-95716 A | 4/2007 |
| JP | 2009-135392 A | 6/2009 |
| JP | 2011-23475 A | 2/2011 |
| JP | 2012-164708 A | 8/2012 |
| JP | 2013-58535 A | 3/2013 |
| JP | 2014-179415 A | 9/2014 |
| JP | 2015-95624 A | 5/2015 |

OTHER PUBLICATIONS

Written Opinion of the International Searching Authority dated Apr. 18, 2017 for corresponding international application PCT/JP2017/006763.

"Hardness of the elements" retrieved from Wikipedia on Sep. 19, 2019. URL: https://en.wikepedia.org/wiki/Hardness_of_the_elements_(data_page), cited in the NPL No. 2.

The extended European search report dated Sep. 30, 2019 for corresponding European patent Application No. 17756570.2, citing the above references.

English Translation of Written Opinion of the International Searching Authority for corresponding International Application PCT/JP2017/006763 dated Apr. 18, 2017.

Office Action issued for corresponding Japanese Patent Application No. 2018-501750 dated Jul. 7, 2020, along with a partial English machine translation.

Office Action issued for corresponding Chinese Patent Application No. 201780013557.0 dated Jan. 6, 2021 along with an English translation.

Communication pursuant to Article 94(3) EPC issued for corresponding European Patent Application No. 17 756 570.2 dated Aug. 12, 2021.

Office Action issued for corresponding Chinese Patent Application No. 201780013557.0 dated Jul. 26, 2021, along with an English translation.

\* cited by examiner

HEAT-RADIATING SUBSTRATE

CROSS REFERENCE TO RELATED APPLICATIONS

This application is a U.S. continuation application filed under U.S.C. § 111(a), of International Application No. PCT/JP2017/006763, filed on Feb. 23, 2017, which claims priority to Japanese Patent Application No. 2016-036032, filed on Feb. 26, 2016, the entire contents of which are incorporated herein by reference.

FIELD

The present invention relates to a heat-radiating substrate suitably applicable to a high-power device and the like exemplified by a high-power LED, a power CPU, an electric power module, and the like.

BACKGROUND

As a traditional heat-radiating substrate for a high-power device and the like on which a high-power LED, a high-power CPU, an electric power module, or the like is mounted, a heat-radiating substrate having a ceramic substrate to which a heat sink composed of a metal is bonded has been employed.

For example, it has been known that a heat-radiating substrate exhibiting a high heat-radiating property as well as a high withstand voltage and high adhesion can be prepared by providing a ceramic layer on a surface of a metal substrate with an aerosol deposition method (hereinafter, referred to as an AD method) and performing an annealing treatment on the ceramic layer in an appropriate temperature range (see, Japanese Patent Application No. 2014-179415).

In addition, it is disclosed that a metal-ceramic composite having high bonding strength and applicable as a highly reliable heat-radiating substrate can be formed by bonding a substrate including copper or a copper alloy as a main component to a ceramic substrate through a bonding layer including copper as a main component (see, Japanese Patent Application No. 2006-128286).

SUMMARY

As described above, although attempts have been made to increase the performance of a heat-radiating substrate from the viewpoint of a withstand voltage, adhesion, and a heat-radiating property, an increase in power, integration, and the like of a module and a device increasingly demands a heat-radiating substrate having an improved heat-radiating property, high adhesion strength, and high reliability. The present invention was made on the basis of this conventional technology and has an object to provide a heat-radiating substrate having an excellent heat-radiating property as well as a necessary insulation-withstand voltage and high adhesion. Furthermore, the present invention has an object to provide a manufacturing method of the heat-radiating substrate.

The inventors found the following knowledge (a) to (c) through various experiment and research to attain the aforementioned objects.

(a) When a ceramic layer serving as an electrically insulating layer is formed on a surface of a metal base material with an AD method, an increase in surface hardness of the metal base material leads to an increase of the density and hardness of the formed ceramic layer as well as an increase of an insulation-withstand electric field (=insulation-withstand voltage of the ceramic layer (electrically insulating layer)/a thickness of the ceramic layer (electrically insulating layer)) thereof. Furthermore, the insulation-withstand electric field is improved and the hardness is also increased by increasing internal compressive stress of the ceramic layer or preventing release of the internal compressive stress of the ceramic layer. That is, there is a relationship in which the Vickers hardness and the insulation-withstand electric field are proportional to the internal compressive stress.

(b) It is expected from the knowledge (a) that, when a metal thin layer having a hardness higher than that of the metal base material is formed on a surface of the metal base material or a hardening treatment is carried out on the surface of the metal base material to form a hardened layer having a hardness higher than that of the metal base material, the ceramic layer formed over the metal thin layer or the hardened layer with an AD method has an insulation-withstand electric field higher than that of a ceramic layer directly formed on the metal base material. Therefore, it is possible to reduce the thickness of the ceramic layer required for a desired insulation-withstand voltage and improve the heat-radiation property.

(c) When a ceramic layer is formed as an electrically insulating layer on a surface of a metal base material with an AD method, the insulation-withstand voltage increases with increasing thickness of the ceramic layer. However, an increasing rate of the insulation-withstand voltage decreases with increasing thickness of the ceramic layer. Therefore, it is expected to be extremely effective to form, between the metal base material and the ceramic layer, a metal thin layer having a hardness higher than that of the metal base material or to provide, as a surface layer of the metal base material, a hardened layer having a hardness higher than that of the metal base material.

The present invention was made on the basis of the aforementioned knowledge, and the following inventions are provided by the present application.

1. A heat-radiating substrate including: a metal base material; a metal thin layer formed over the metal base material, the metal thin layer having a hardness higher than that of the metal base material; and a ceramic layer formed over the metal thin layer.

2. A heat-radiating substrate including: a metal base material; a hardened layer serving as a surface layer of the metal base material and having a hardness higher than that of the metal base material; and a ceramic layer formed over the hardened layer.

3. The heat-radiating substrate where the metal thin layer or the hardened layer functions as a metal thin layer for enhancing compressive stress to enhance compressive stress in the ceramic layer by a mechanical impact applied to the ceramic layer.

4. The heat-radiating substrate where the metal thin layer or the hardened layer functions as a layer for preventing release of compressive stress to prevent release of compressive stress in the ceramic layer by a mechanical impact applied to the ceramic layer.

5. The heat-radiating substrate including an adhesion-enhancing layer between the metal base material and the metal thin layer.

6. The heat-radiating substrate including an anchor layer between the metal thin layer and the ceramic layer.

7. The heat-radiating substrate where the metal thin layer for enhancing compressive stress or the layer for preventing release of compressive stress has a thickness of 0.3 μm to 70 μm.

8. The heat-radiating substrate where the metal thin layer for enhancing compressive stress or the layer for preventing release of compressive stress has a hardness of 100 Hv to 700. Hv.

9. The heat-radiating substrate where the metal thin layer for enhancing compressive stress or the layer for preventing release of compressive stress is composed of stainless steel.

10. The heat-radiating substrate where the metal base material is a heat-sink material including copper, aluminum, and the like.

11. The heat-radiating substrate where the ceramic layer has a thickness of 5 μm to 50 μm.

It is preferred that the metal thin layer or the hardened layer serve as a layer for enhancing compressive stress to enhance the compressive stress in the ceramic layer by a mechanical impact applied to the ceramic layer. Furthermore, it is preferred that the metal thin layer or the hardened layer serve as a layer for preventing release of compressive stress to prevent release of the compressive stress in the ceramic layer by a mechanical impact applied to the ceramic layer.

The adhesion-enhancing layer may be provided over the metal base material in order to increase adhesion with the metal thin layer or the hardened layer. The adhesion-enhancing layer is preferred to be formed with a material such aluminum nitride, silicon carbide, or aluminum oxide at a thickness of 10 μm or less and to have a thermal conductivity of 20 Wm$^{-1}$K$^{-1}$ or more. Note that it is not always necessary to provide the adhesion-enhancing layer when the adhesion strength between the metal base material and the metal thin layer is high.

The anchor layer may be provided between the metal thin layer and the ceramic layer.

The metal thin layer is disposed over the metal base material and is preferred to have a hardness higher than that of the metal base material and a thickness equal to or smaller than 100 μm or 0.3 μm to 70 μm.

The heat-radiating substrate according to the present invention is prepared by providing a metal thin layer on a surface of a metal base material or providing a hardened layer as a surface layer of the metal base material, followed by disposing a ceramic layer formed with an AD method over the metal thin layer or the hardened layer. Hence, a thickness of the ceramic layer required for a desired insulation-withstand voltage can be reduced, and a heat-radiating substrate with an excellent heat-radiating property can be obtained.

As a result, it is possible to effectively release the heat generated during operation of a power device mounted on the heat-radiating substrate, such as high-luminance LED (Light-Emitting Diode), an IGBT (Insulated gate Bipolar Transistor), and a power MOSFET (Metal-Oxide-Semiconductor Field Effect Transistor), to the outside thereof and to suppress increase of the operation temperature of the power device.

DESCRIPTION OF EMBODIMENTS

Figure 1:
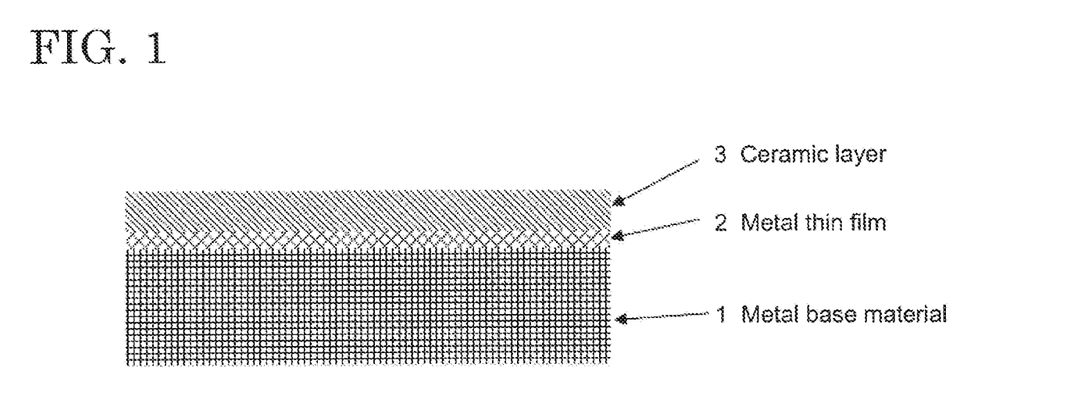
FIG. 1 is a schematic view showing a structure of a typical heat-radiating substrate according to the present invention.

A heat-radiating substrate according to the present invention possesses, over a metal thin layer formed over a metal base material or a hardened layer provided as a surface layer of the metal base material, a ceramic layer formed with an AD method (see FIG. 1). With this structure, the heat-radiating substrate has a high insulation-withstand voltage and a high heat-radiating property. Here, it is preferred that the metal thin layer or the hardened layer have a high hardness compared with the metal base material. This is because an increase of a mechanical impact of the ceramic fine particles to the metal base material caused by the use of the metal thin layer having a higher hardness than the metal base material improves adhesion with the metal base material, resulting in an increase of compressive stress in the ceramic layer or preventing release of the compressive stress in the ceramic layer. For this reason, as demonstrated by the results described below, the hardness and the insulation-withstand voltage of the ceramic layer are improved, and the thickness of the ceramic layer required to obtain a heat-radiating substrate having the same characteristic regarding the insulation-withstand voltage can be reduced. Thus, not only is the heat-radiating property improved due to a decrease of the thermal resistance of the metal thin layer, but also the manufacturing cost of the heat-radiating substrate can be reduced.

The metal thin layer or the hardened layer as the surface layer of the metal base material is preferred to act as a layer for enhancing compressive stress to enhance the compressive stress in the ceramic layer by a mechanical impact applied to the ceramic layer. In addition, the metal thin layer or the hardened layer as the surface layer of the metal base material is preferred to act as a layer for preventing release of compressive stress to prevent release of the compressive stress in the ceramic layer generated by a mechanical impact applied to the ceramic layer.

Figure 2:
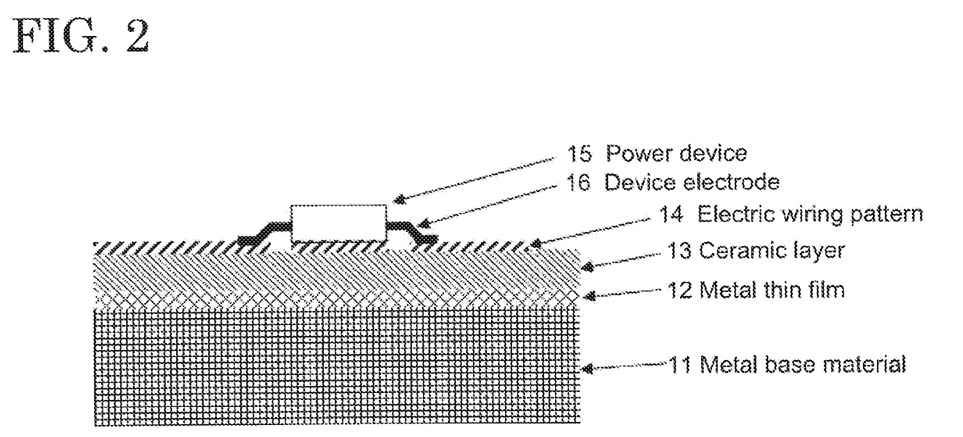
FIG. 2 is a schematic view showing another heat-radiating substrate according to the present invention.

As shown in FIG. 2, the heat-radiating substrate according to the present invention can be manufactured by forming an electric wiring pattern 14 over the ceramic layer 13 from the heat-radiating substrate illustrated in FIG. 1. The heat-radiating substrate is used by mounting on electric devices or electric parts (see FIG. 2). The heat-radiating substrate can be particularly used as a heat-radiating substrate on which electric devices such as a power device represented by an LED and IGBT are mounted.

The metal base material may be composed of a main-component metal (50% wt % or more, preferably 80 wt % or more, or more preferably 90 wt % or more) and a material other than the metal. As the material serving as the main component of the metal base material, it is possible to use a metal widely utilized in a heat sink, a heat slag, and the like, for example. As the material other than the metal, a ceramic material is represented. However, the material is not limited thereto. For example, it is possible to use, as the material other than the metal, a material in which a ceramic material is mixed with a metal material to adjust thermal conductivity, and a thermal expansion coefficient, or the like.

A shape and a stereostructure of the metal base material are not limited and may be a plate shape. A variety of the stereostructures such as a fin-shaped structure capable of promoting heat radiation may be employed.

When copper having a high thermal conductivity is used for the metal base material, it is preferred to use stainless steel generally having a hardness higher than that of copper for the metal thin layer. When the metal thin layer has a lower thermal conductivity than the metal base material, a higher heat-radiating effect is expected by arranging the metal thin layer to have a thickness of 100 μm or less to reduce the thermal resistance.

That is, it is possible to improve the heat-radiating performance by forming the metal thin layer as a metal foil or metal foil sheet with a thickness of 100 μm or less and adhering the metal thin layer to the metal base material. When the material of the metal thin layer has a thermal conductivity similar to or higher than that of the metal base material, or when the cost of the metal thin layer is higher than that of the metal base material, the cost of all of the materials can be reduced by decreasing the thickness of the metal thin layer.

It is preferred to use a metal having a thermal conductivity of 50 $Wm^{-1}K^{-1}$ or more as the material of the metal thin layer. For example, a metal such as nickel, chromium, copper, silver, gold, aluminum, tungsten, molybdenum, and magnesium, an alloy thereof, and an alloy including Fe as a main component, such as stainless steel (SUS) and carbon steel are represented.

The metal thin layer can be formed by adhering the metal thin layer to the metal base material. However, the metal thin layer may be formed by a thin-film coating method including a plating method and an AD method or a combination thereof. For example, copper may be used as the metal base material, and the widely known nickel plating, chromium plating, or nickel-chromium plating may be performed in a range of several micrometers to several tens of micrometers. The metal thin layer with a hardness of approximately 200 Hv or more can be formed by performing the aforementioned plating while the hardness of a copper metal-base material is approximately 100 Hv or less prior to plating.

It is preferred that the metal thin layer be formed over the metal base material with a material different from that of the metal base material because a desired hardness can be readily obtained. However, the metal thin layer may be formed with a metal material the same as that of the metal base material. For example, a hardening treatment may be performed on the surface of the aforementioned metal base material to form, as the surface layer, the hardened layer having a hardness higher than that of the metal base material. The hardening treatment for increasing the hardness of the surface of the metal base material is not limited, and known technologies such as shot-peening, a nitrogen-treatment, and a carburizing treatment may be employed. Note that, although a thickness (depth from a surface) of the surface layer having a higher hardness than that of the metal base material, which is formed by shot-peening, a nitrogen-treatment, or a carburizing treatment, is generally less than 30 μm, the surface layer having a hardness higher than that of the metal base material by 10% or more has a thickness smaller than 20 μm.

When the hardness of the metal thin layer is higher than that of the metal base material, the insulation-withstand voltage of the ceramic layer formed thereover with an AD method is higher than that of a ceramic layer directly prepared on the surface of the metal base material with the same material at the same thickness. Therefore, a difference in Vickers hardness between the metal thin layer and the metal base material is preferably as large as possible, and it is practically preferred to adjust the difference in Vickers hardness between the metal thin layer and the metal base material to be equal to or more than 10%.

The ceramic layer is preferred to be formed with an AD method. An AD method is one of the injection-processing methods to form a deposition film having high mechanical strength, which includes accelerating fine particles such as ceramic particles to a predetermined rate, colliding the particles with a base material, fragmentating and plastically deforming the particles by utilizing a mechanical impact force generated at the collision to form and bond an anchor layer at an interface with the base material, and bonding the fragmented particles to each other to increase adhesion with the base material. With this method, bonding exhibiting high reliability on a thermal shock, a thermal cycle, and the like can be obtained.

The thickness of the ceramic layer is adjusted within a range which provides an insulation-withstand voltage required for modules and devices. Since the ceramic layer generally has a thermal conductivity lower than that of the metal base material, the thickness is selected from a range capable of providing a required insulation-withstand voltage and is preferably as small as possible in terms of a heat-radiating property. Hence, the thickness of the ceramic layer is determined in view of a required insulation-withstand voltage and heat-radiating property and is preferably 5 μm to 50 μm.

The ceramic layer may be formed over the whole of or at least a part of the surface of the metal thin layer over the metal base material.

A ceramic layer has been widely utilized as a dielectric material structuring a circuit substrate in the present technical field. An electrically insulating ceramic material such as aluminum oxide, aluminum nitride, silicon nitride, silicon carbide, silicon oxide, and beryllium oxide or a material in which these materials are mixed can be used for the ceramic layer.

EXAMPLE

Hereinafter, a series of evaluation results leading to the present invention and a ground for application to the present invention are explained.

Evaluated samples were prepared by using a flat metal substrate as the metal base material and forming the ceramic layer serving as an electrically insulating layer over the metal base material with an AD method. The formation of the ceramic layer was carried out using an aerosol-deposition film-formation apparatus equipped with an aerosol chamber and a film-formation chamber, and the ceramic layer was prepared at a thickness of 10 μm. Aluminum oxide powder was used as a raw material, and the film formation was conducted by using the powder treated under the temperature-variable conditions prior to the film formation.

Aluminum and stainless steel which are two kinds of metal including different materials (i.e., metals with different hardness) were used for the metal base material. The ceramic layer of aluminum oxide was prepared over these metal base materials. An electrode was disposed on a surface of the electrically insulating ceramic layer, and the insulation-withstand voltage was measured by applying a direct current between the metal substrate and the electrode. The results are shown in Table 1.

TABLE 1

| Sample | Material for metal base material | Material for insulating layer | Powder treatment prior to film formation | Insulation-withstand voltage [kV] | Vickers hardness [Hv] |
|---|---|---|---|---|---|
| 1 | Al | aluminum oxide | condition 1 | 1.47 | 825 |
| 2 | Al | aluminum oxide | condition 2 | 1.65 | 937 |
| 3 | Al | aluminum oxide | condition 3 | 1.83 | 994 |
| 4 | stainless | aluminum oxide | condition 4 | 2.85 | 1589 |

As shown in Table 1, when the metal base material is aluminum, the insulation-withstand voltage with respect to the 10 μm thickness of the ceramic layer is approximately 1.4 kV (corresponding to the insulation-withstand electric field of 140 V/μm), and a maximum insulation-withstand voltage of approximately 1.8 kV (corresponding to the insulation-withstand electric field of 180 V/μm) was obtained depending on the powder-treatment conditions prior to the film-formation. When the metal base material is stainless steel, the insulation-withstand voltage is approximately 2.9 kV (corresponding to the insulation-withstand electric field of 290 V/μm). The use of stainless steel for the metal base material increases the insulation-withstand voltage by approximately 1 kV. Measurement of the Vickers hardness of the ceramic layer serving as an electrically insulating layer with a microhardness tester revealed that a hardness of 800 to 1000 Hv can be obtained in the case where the metal base material is aluminum and that a hardness close to 1600 Hv is attainable in the case where the metal base material is stainless steel. The hardness of stainless steel was equal to or higher than 200 Hv while the hardness of aluminum in the metal base material which structures the samples used for evaluation was approximately 100 Hv or less. From these results, it is considered that, when the ceramic layer is formed over stainless steel, the insulation-withstand voltage and the hardness are increased due to the increase in hardness of the metal base material. Similar to the aluminum base material, the same results as those of the aluminum base material were obtained in the case of a copper base material with a hardness of equal to or less than 100 Hv.

Figure 3:
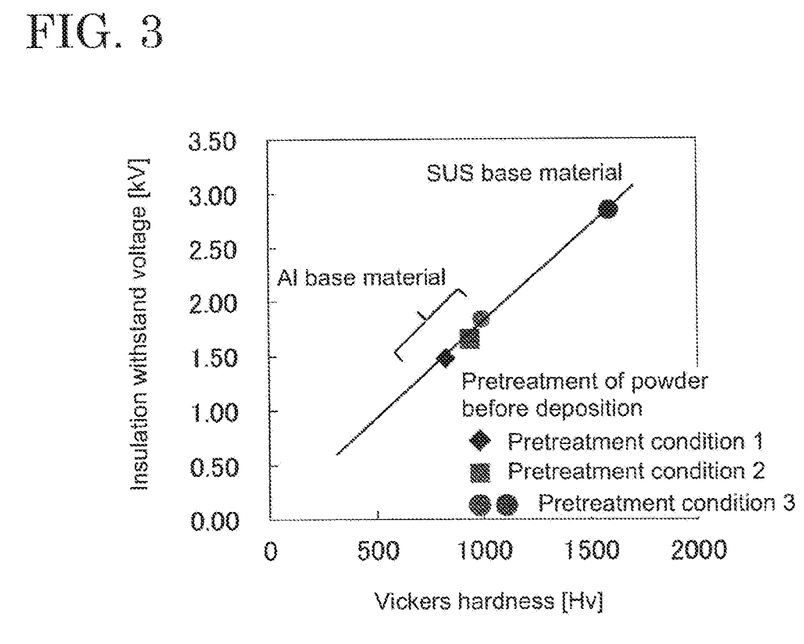
FIG. 3 is a diagram showing a relationship between the Vickers hardness and the insulation-withstanding voltage of the ceramic layer (electrically insulating layer)

FIG. 3 shows a relationship between the insulation-withstand voltage corresponding to the 10 μm thickness of the ceramic layer and the hardness. It can be understood that the insulation-withstand voltage and the hardness are almost in a linear relationship. This relationship may be interpreted as follows: an increase in hardness of the metal base material serving as a base of the ceramic layer results in an increase of the mechanical impact force of the ceramic particles forming an electrically insulating layer to the base material. Accordingly, the compressive stress in the electrically insulating layer is increased or release of the internal compressive stress is prevented, which leads to an increase of the density of the electrically insulating layer and improvement of the Vickers hardness and the insulation-withstand voltage.

As described above, it is possible to form the ceramic layer having an increased insulation-withstand voltage when the hardness of the metal base material used for forming the ceramic layer is increased. Hence, the heat-radiating substrate in which the metal thin layer having a hardness higher than that of the metal base material is formed as a base over the metal base material and the ceramic layer is formed over the metal thin layer is effective for a heat-radiating substrate having a high insulation-withstand voltage.

Figure 4:
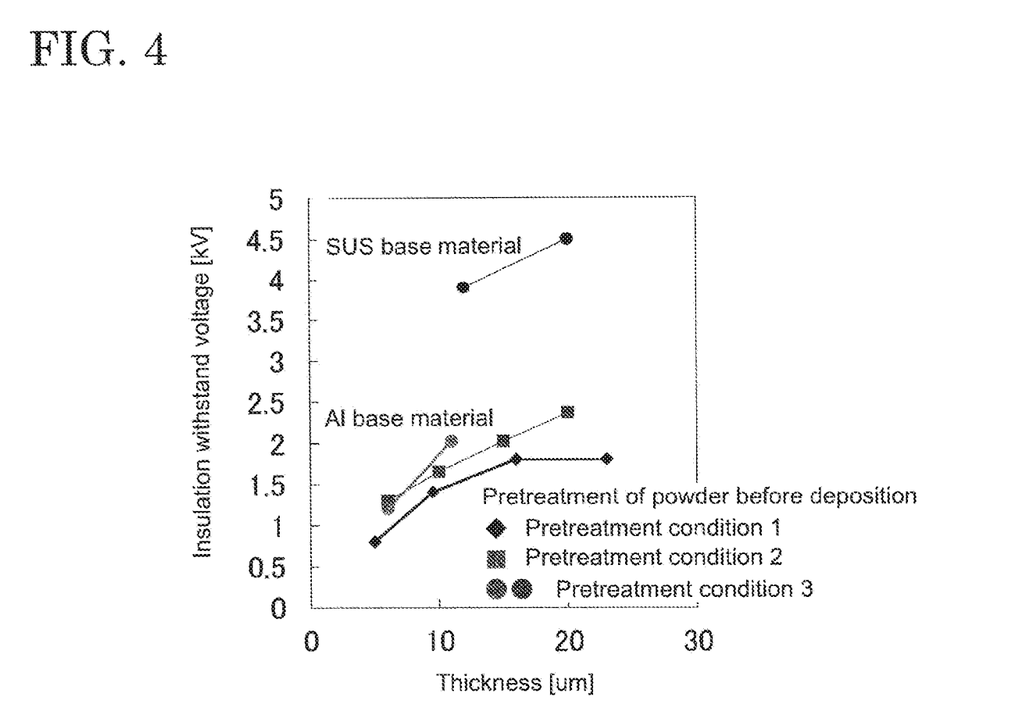
FIG. 4 is a diagram showing a relationship between the thickness and the insulation-withstanding voltage of the ceramic layer (electrically insulating layer).

The experimentally measured thickness and the insulation-withstand voltage of the ceramic layer are shown in FIG. 4. FIG. 4 demonstrates a relationship between the thickness and the insulation-withstand voltage of the ceramic layer in the case where the ceramic layer is deposited over the metal base material with an AD method. From these results, it can be understood that the insulation-withstand voltage has a non-linear relationship with the thickness of the ceramic layer. For example, the use of the aluminum base material or the copper base material is disadvantageous in terms of heat radiation because it is required to increase the thickness of the ceramic layer to more than double in order to double the desired insulation-withstand voltage. Therefore, the use of a metal base material of stainless steel having a high hardness increases the insulation-withstand voltage, allows the thickness of an electrically insulating layer to be reduced to a thickness providing a desired insulation-withstand voltage, and improves the heat-radiation property by a value corresponding to the reduction in thickness. A thermal conductivity of a metal base material with a high hardness is not always as high as that of a copper base material. Thus, as described above, it is preferred to reduce the thickness of the metal thin layer to a maximum extent in order to realize a high insulation-withstand voltage and a high heat-radiation property.

Hence, the internal compressive stress of the ceramic layer is increased or release or the internal compressive stress is prevented by forming the metal thin layer with a high hardness serving as a base at the time when the ceramic layer serving as an electrically insulating layer is formed over the metal base material with an AD method, by which the insulation-withstand voltage per the thickness of the ceramic layer can be remarkably increased. As a result, when a circuit substrate is designed so as to have a withstand voltage the same as that of a traditional circuit substrate, the thickness of the ceramic layer serving as an electrically insulating layer can be significantly reduced compared with the traditional one. Accordingly, the heat resistance of the ceramic layer can be drastically decreased, the heat-radiating property of the substrate can be remarkably improved, and the manufacturing cost can be simultaneously decreased.

The heat-radiating substrate according to the present invention is suitably utilized in a high-power device on which a high-power LED, a high-power CPU, an electric power module, or the like is mounted.

What is claimed is:
1. A heat-radiating substrate comprising:
a metal base material comprising a first metal;
a metal thin layer over and in contact with the metal base material, the metal thin layer consisting of a second metal which is different from the first metal; and
a ceramic layer over and in contact with the metal thin layer, wherein a hardness of the second metal is higher than a hardness of the first metal, and wherein an amount of the first metal in the metal base material is 90 wt % or more.

2. The heat-radiating substrate according to claim 1, wherein the metal thin layer functions as a layer for enhancing compressive stress in the ceramic layer by a mechanical impact applied to the ceramic layer.

3. The heat-radiating substrate according to claim 1, wherein the metal thin layer functions as a layer for preventing release of compressive stress in the ceramic layer by a mechanical impact applied to the ceramic layer.

4. The heat-radiating substrate according to claim 1, wherein the metal thin layer has a thickness of 0.3 μm to 70 μm.

5. The heat-radiating substrate according to claim 1, wherein the metal thin layer has a hardness of 100 Hv to 700 Hv.

6. The heat-radiating substrate according to claim 1, wherein the second metal is one selected from the group consisting of nickel, chromium, silver, gold, aluminum, tungsten, molybdenum, and magnesium.

7. The heat-radiating substrate according to claim 1, wherein the metal base material includes copper or aluminum.

8. The heat-radiating substrate according to claim 1, wherein the ceramic layer has a thickness of 5 μm to 50 μm.

9. The heat-radiating substrate according to claim 1, wherein the metal thin layer consists of one layer.

* * * * *